US008817832B2

(12) United States Patent  
Trela et al.

(10) Patent No.: US 8,817,832 B2
(45) Date of Patent: Aug. 26, 2014

(54) MULTI-WAVELENGTH DIODE LASER ARRAY

(75) Inventors: Natalia Trela, Edinburgh (GB); Howard John Baker, Edinburgh (GB); Roy McBride, Lochgelly (GB)

(73) Assignee: Power Photonic Ltd., Dalgety Bay (GB)

( * ) Notice: Subject to any disclaimer, the term of this patent is extended or adjusted under 35 U.S.C. 154(b) by 164 days.

(21) Appl. No.: 13/465,828

(22) Filed: May 7, 2012

(65) Prior Publication Data

US 2013/0121360 A1    May 16, 2013

(30) Foreign Application Priority Data

May 12, 2011   (GB) .................................. 1107948.0

(51) Int. Cl.
*H01S 5/40* (2006.01)
*H01S 5/14* (2006.01)

(52) U.S. Cl.
CPC ................. *H01S 5/4025* (2013.01); *H01S 5/14* (2013.01); *H01S 5/141* (2013.01); *H01S 5/143* (2013.01); *H01S 5/4062* (2013.01); *H01S 5/4087* (2013.01)
USPC ..................... 372/23; 372/50.11; 372/50.121; 372/102

(58) Field of Classification Search
CPC .......... H01S 5/14; H01S 5/141; H01S 5/143; H01S 5/4062; H01S 5/4087; H01S 5/4075; H01S 3/812
USPC ............... 372/50.11, 50.112, 50.121, 23, 102
See application file for complete search history.

(56) References Cited

U.S. PATENT DOCUMENTS

| 5,691,989 | A | 11/1997 | Rakuljic et al. |
| 6,192,062 | B1 | 2/2001 | Sanchez-Rubio et al. |
| 6,208,679 | B1 | 3/2001 | Sanchez-Rubio et al. |
| 6,240,116 | B1 * | 5/2001 | Lang et al. ................. 372/50.12 |
| 6,327,292 | B1 | 12/2001 | Sanchez-Rubio et al. |
| 7,636,376 | B2 * | 12/2009 | Moser et al. .................... 372/20 |
| 2006/0114955 | A1 | 6/2006 | Steckman |
| 2006/0256827 | A1 * | 11/2006 | Volodin et al. ........... 372/50.121 |
| 2010/0110556 | A1 | 5/2010 | Chann et al. |

OTHER PUBLICATIONS

Moser, "Self Aligned non-dispersive external cavity tuneable laser," Optics Express 2008, vol. 16, No. 21, 16691-16696, Optical Society of America.
Chann, "Efficient high brightness wavelength-beam combined commercial off-the-shelf diode stacks achieved by use of a wavelength chirped volume Bragg grating," Optics Letters 2006, vol. 31, No. 9, 1253-1255, Optical Society of America.
Trela, "Wavelength locking of an ultra-collimated 49 element single-mode laser array by a distant VHG," CLEO/QLES, San Jose, 2010.

* cited by examiner

*Primary Examiner* — Julio J Maldonado
*Assistant Examiner* — Michael Carter
(74) *Attorney, Agent, or Firm* — Law Office of Jesse D. Lambert, LLC

(57) ABSTRACT

A multi-wavelength laser array of a plurality of emitters in a diode bar or stack where each beam is deflected by a different angle to be incident upon a uniform volume holographic grating with a portion of the beam being deflected as a feedback portion while a further portion provides a wavelength tuned output unique to each emitter. The arrangement of a uniform volume holographic grating with deflectors such as phaseplates eliminates the need to use expensive wavelength chirped gratings.

21 Claims, 19 Drawing Sheets

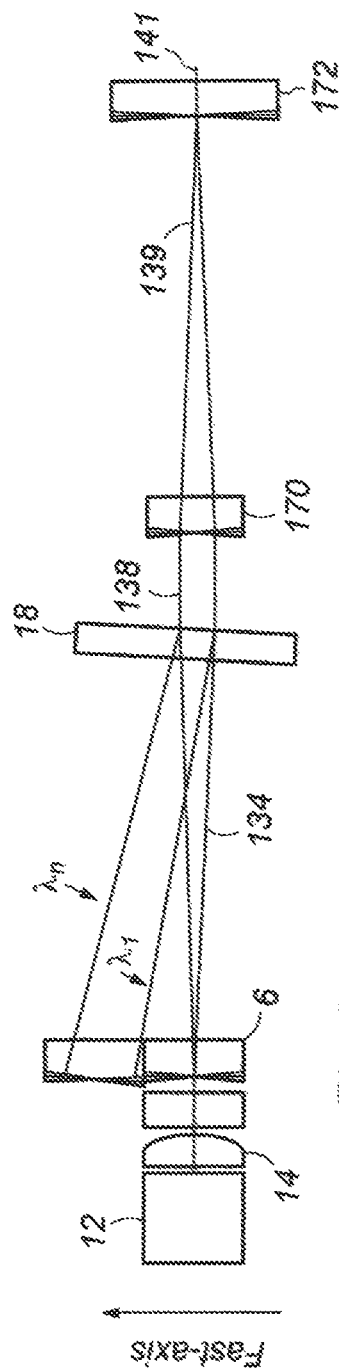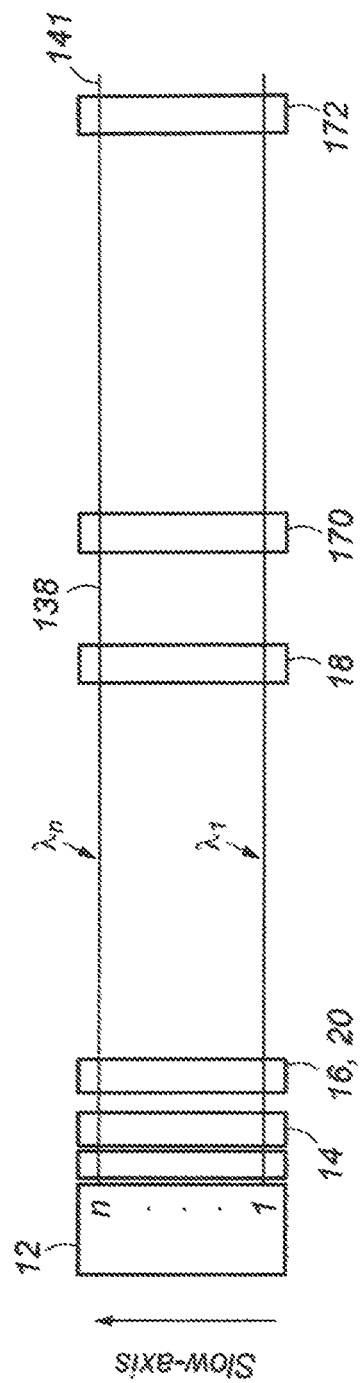
Fig. 7a
Fig. 7b

MULTI-WAVELENGTH DIODE LASER ARRAY

FIELD OF THE INVENTION

The present invention relates to diode lasers and in particular, though not exclusively, to an apparatus for providing a multi-wavelength diode laser array.

BACKGROUND OF THE INVENTION

Diode lasers are formed from a long semiconductor bar fabricated with a row of spaced apart emitters. A typical diode bar is a 10 mm long semiconductor bar fabricated with 19 to 79 emitters having widths of 100 to 200 µm. Fill factors can be from 8% to 80% giving variable pitch to fill the length. To increase the power output, the diode bars are stacked with a bar pitch in the range 1 to 2 mm for CW stacks, while for QCW stacks pitch can be smaller, in the range 300 µm to 2 mm. Commercially produced units, emitting 50-100 W per bar, are stacked on typically 1.8 mm pitch to build up a total laser power of 500-1000 W. However, power levels up to 500 W per bar on QCW systems, are achievable.

While each emitter is designed to be identical, manufacturing tolerances and environmental influences mean that each emitter produces a beam of variable wavelength, spectral shape, beam angle and divergence. Consequently these individual beams must be combined effectively to provide a suitable output in terms of power, brightness and beam quality for a desired application.

An increasing application area is in laser material processing. High brightness is required in order to deliver sufficient power with a specified spot size at the workpiece. Also, it is often desirable to deliver the output of the diode laser to the workpiece via an optical fibre. High brightness is then required in order to launch sufficient power into the limited etendue of the optical fibre. Wavelength division multiplexing provides a means of combining the beams from multiple diode laser sources to achieve increased brightness. Wavelength division multiplexing of a large number of sources requires dense spectral combining. Many practical schemes for dense spectral combining require sources of narrow linewidth at uniformly-spaced wavelength intervals.

It is known that use of a volume holographic grating or volume Bragg grating can stabilize and lock the wavelength of a single emitter. A single volume holographic grating has also been used on a laser diode bar to lock all the emitters to a single wavelength over a narrow spectrum. With the addition of collimating optics this provides an array of output beams matched to the centre frequency of the grating. The system can be scaled to stacks of diode bars by either using multiple volume holographic gratings or a single volume holographic grating with suitable dimensions. These scaled arrangements provide power scaling without increasing brightness as the output is centred at a single wavelength with a narrow spectrum.

Combining optical beams of multiple wavelengths provides increased brightness. For each emitter to be locked to a unique wavelength would require a volume holographic grating with a different resonant wavelength for each emitter in an array. This could be achieved using a large number of gratings at stepped increments in wavelength. This would require a large number of well-toleranced grating parts, and would be complex to assemble. This has been overcome by developing a wavelength chirped volume holographic grating. A typical wavelength chirped volume holographic grating is manufactured to have dimensions comparable to the emitter array, with the wavelength chirped in the bar axis, the stack axis or both.

Typically a wavelength chirped volume holographic grating is mounted directly in front of the emitter array. Collimating optics may be located between the emitters and the wavelength chirped volume holographic grating to reduce divergence, avoid overlapping of the beams and ensure that they are incident at right angles to the wavelength chirped volume holographic grating. In some applications, the grating is wavelength chirped on a single axis. In this way, all the emitters on a laser diode bar are locked to the same wavelength, with each bar operating on a different wavelength. The output is then combined optically to provide a multi-wavelength beam.

A disadvantage in the use of wavelength chirped volume holographic gratings is in the cost of their manufacture. These are expensive components as compared to uniform volume holographic gratings which are tuned to a single frequency. Adoption of one or more wavelength chirped volume holographic gratings in a laser arrangement significantly increases the manufacturing costs to provide the high spectral brightness desired from such lasers.

It is therefore an object of the present invention to provide a multi-wavelength laser array without the requirement of a wavelength chirped volume holographic grating.

It is a further object of the present invention to provide a multi-wavelength laser array using a uniform volume holographic grating.

It is a further object of at least one embodiment of the present invention to provide a multi-wavelength laser array from a diode laser bar.

SUMMARY OF THE INVENTION

According to a first aspect of the present invention there is provided a multi-wavelength laser array, the array comprising:

a plurality of emitters arranged on at least a first axis providing a plurality of beams substantially in a first direction orthogonal to the first axis;

at least one first deflector arranged to deflect each beam on the first axis in a different direction;

a volume holographic grating arranged at a tilt angle to the first direction and each beam being incident upon the grating;

at least one second deflector arranged to deflect a feedback portion of each beam on itself to the respective emitter; and a further portion of each beam providing a wavelength tuned output unique to each beam on the first axis.

Each beam which is incident upon the volume holographic grating at a different angle is locked to a different wavelength by the grating. Thus a uniform volume holographic grating is used to provide an array of locked multi-wavelength beams.

In a first embodiment of the present invention the volume holographic grating is selected to reflect a first portion of each beam and transmit a second portion of each beam and the at least one second deflector is arranged to return the feedback portion of each beam. In this embodiment a uniform volume holographic grating can be used.

Preferably the at least one second deflector is arranged to return the first portion of each beam. In this way a folded external cavity is provided, giving a more compact arrangement.

Preferably the at least one first deflector is a monolithic array of deflector elements. In this way only a single optical component needs to be positioned between the emitters and the volume holographic grating. The deflector elements may be prisms. Current technology, in Applicants' co-pending patent application GB1020246.3, can machine these elements on a substrate to deflect the beams by known degrees. The elements may be arranged in one or two dimensions. The at least one first deflector may be a phaseplate. A phaseplate is an optical element whose surface profile is not restricted to the range of surface forms used to make individual prisms and lenses. A phaseplate can incorporate arrays of identical or differing prisms and lenses as well as refractive and diffractive surfaces of arbitrary, within the limits of the manufacturing process used.

Preferably the at least one second deflector is a monolithic array of deflector elements having a mirrored back surface. In this way a single optical component only needs to be positioned to collect and reflect the beams from/to the volume holographic grating. The deflector elements may be prisms. The elements may be arranged in one or two dimensions. The at least one second deflector may be a phaseplate. The deflector elements may include a weak cylindrical lens. This will compensate for the divergence in the beams being fed back to the emitters.

Preferably at least one second deflector is mounted adjacent to the at least one first deflector. Advantageously, the at least one first and second deflectors are created as a single monolithic array.

Preferably the plurality of emitters is arranged on the first axis wherein the first axis is the slow axis. This linear array is a diode bar and each emitter will produce a beam at a unique wavelength. The wavelengths will be distinct from each other.

In an embodiment, the plurality of emitters is arranged on two axes perpendicular to each other and orthogonal to the first direction. This describes a stack of diode bars. The first axis may be arranged along each diode bar, the first axis being the slow axis, providing the same multi-wavelengths within each bar. Alternatively, the first axis may be arranged across the stack, the first axis being the fast axis. In one embodiment, each diode bar will have a unique wavelength, and the wavelength will vary across the stack. In a further embodiment, each diode bar will operate over the same wavelength range, and the wavelength will vary along the bar. In a yet further embodiment, the deflector elements may be selected for each emitter across both axes, and thus each beam from the two-dimensional array will have a separate distinct wavelength.

In an alternative embodiment, each diode bar in a stack has a first and a second deflector. This simplifies the construction of the deflectors and provides the choice of whether the emitters in a bar are locked to the same or different wavelengths.

Preferably the array includes at least one collimator. Preferably the at least one collimator is located between the emitters and the at least one first deflector. Advantageously, the collimator is a monolithic array of elements. This allows collimation along the slow axis and/or the fast axis, for single or groups of emitters. Advantageously the collimator includes smile compensation or wavefront compensation. Preferably the collimator is a slow axis collimator. Preferably the collimator is a fast axis collimator. Preferably the collimator is a slow axis and a fast axis collimator. Advantageously, the slow axis collimator and the fast axis collimator are combined on a single monolithic structure. In this way a single optical element only needs to be located between the emitters and the first deflector(s).

Alternatively, the first deflector may be combined with a slow axis collimator. In this way, the arrangement is suited for use with a fast axis collimator which is pre-fitted to the laser array.

Advantageously, the first deflector may be arranged adjacent to the volume holographic grating. In this way, the spatial offset of the beams is minimised.

Preferably, the multi-wavelength laser array further comprises a third deflector, the third deflector arranged to deflect the transmitted second portion on exit from the volume holographic grating. In this way, the third deflector may remove any angular offset between each beam.

Advantageously, the first deflector, volume holographic grating and the third deflector may be provided as a single pre-aligned optical assembly. In this way, the multi-wavelength laser array is made easier to assemble and align.

Preferably, the multi-wavelength laser array further comprises a quarter-wave-plate and polarising beam splitter combination, the combination being located between the emitters and the first deflector, to redirect the first portion towards the second deflector. In this way, the second deflector may be arranged in parallel to the first axis to provide a more compact arrangement.

Optionally, the multi-wavelengths may be stepped. In this way, distinct wavelengths of narrow spectra are distinguished between the output beams. Alternatively, the spacing between the central wavelengths for adjacent emitters may be smaller than the spectral width for an individual emitter, in which case the spectra of adjacent emitters overlap and the overall spectrum of the combined output may be continuous.

Preferably also the multi-wavelength laser array also comprises wavelength multiplexing optics to combine the beams into a single beam of multiple wavelengths.

In a second embodiment of the present invention the volume holographic grating is selected to totally reflect each beam and a partially reflective surface is provided to return the feedback portion of each beam while transmitting the further portion to provide the wavelength tuned output unique to each beam.

Preferably, the volume holographic grating has substantially 100% reflectivity. In this way, the volume holographic grating has substantially 100% diffraction efficiency. Further, in this way, the volume holographic grating does not make contribution to power loss in the output.

Preferably the at least one first deflector is according to the first aspect.

Preferably the at least one second deflector is a monolithic array of deflector elements. More preferably, the at least one second deflector includes the partially reflective surface as a mirrored back surface. Preferably, the mirrored surface has a high transmissivity. In this way, a small portion (say 10%) of the beam is fed back to the emitters. In this way a single optical component only needs to be positioned to reflect the beams back to the emitters while acting as an output coupler. The deflector elements may be prisms. The elements may be arranged in one or two dimensions. The at least one second deflector may be a phaseplate. The deflector elements may include a cylindrical lens.

Optionally, the at least one second deflector includes a mirrored back surface with 100% reflectivity. In this embodiment, the partially reflective surface may be located upon at least one output coupler as is known in the art. Alternatively, the partially reflective surface may be located on at least one additional deflector.

Preferably the at least one additional deflector is a monolithic array of deflector elements. More preferably, the at least one additional deflector includes the partially reflective surface as a mirrored back surface. Preferably, the mirrored surface has a high transmissivity. In this way, a small portion (say 10%) of the beam is fed back to the emitters. In this way, beam correction can be applied from a single optical component which acts as an output coupler. The deflector elements may be prisms. The elements may be arranged in one or two dimensions. The at least one third deflector may be a phaseplate. The deflector elements may include a cylindrical lens.

Optionally, further features of the second embodiment may be as described for the first embodiment.

In a third embodiment of the present invention the volume holographic grating is selected to deflect at least a portion of each beam as the beam passes through the grating and a surface being at least partially reflective is provided to return the feedback portion of each deflected beam.

As the volume holographic grating does not reflect the beams but only transmits or deflects them, then the volume holographic grating may be referred to as a transmissive volume holographic grating.

Preferably the volume holographic grating has a diffraction efficiency of around 10%. In this way the volume holographic grating will deflect a portion being around 10% of each beam, leaving the remaining portion of each beam to provide the wavelength tuned output. In this embodiment, the surface is totally reflective.

Alternatively, the volume holographic grating has a diffraction efficiency of around 100%. In this way the volume holographic grating will totally deflect each beam and the surface is partially reflective to transmit the remaining portion as the wavelength tuned output.

Preferably the at least one first deflector is according to the first aspect.

Preferably the at least one second deflector is a monolithic array of deflector elements. The deflector elements may be prisms. The elements may be arranged in one or two dimensions. The at least one second deflector may be a phaseplate. The deflector elements may include a weak cylindrical lens. This will compensate for the divergence in the beams being fed back to the emitters.

Preferably the surface is a mirrored back surface on the at least one second deflector. Preferably, the mirrored back surface has a high transmissivity. In this way a small portion (say 10%) of each beam is fed back to the emitters. In this way a single optical component only needs to be positioned to reflect the beams back to the emitters while acting as an output coupler. Alternatively, the at least one second deflector includes a mirrored back surface with 100% reflectivity. Again, a single component is advantageously provided, with the output now from the undeflected remaining portion of each beam Alternatively, the surface is a mirrored surface on an element. In this way, an output coupler or a 100% reflecting mirror is provided to return a feedback portion of each deflected beam.

Optionally, further features of the third embodiment may be as described for the first and second embodiments.

According to a second aspect of the present invention there is provided a method of obtaining a multi-wavelength output from a laser array, the method comprising the steps:
 (a) providing an array of emitters, each emitter having an output beam;
 (b) directing the output beams to be incident upon a volume holographic grating at different angles of incidence;
 (c) deflecting a portion of the output beams back into their respective emitters and thereby locking each emitter output beam to a different wavelength;
 (d) taking a remaining portion of the output beams as a multi-wavelength output of the laser array.

In a first embodiment the portion of the output beams at step (c) are reflected. In a second embodiment, there is an additional step of totally reflecting the beams from the volume holographic grating. In a third embodiment, there is an additional step of deflecting at least a portion of the beams through the volume holographic grating.

BRIEF DESCRIPTION OF DRAWINGS

Embodiments of the present invention will now be described, by way of example only, with reference to the following drawings of which:

FIG. 7 is an illustration of a (a) side view and (b) top view of a multi-wavelength laser array according to a further embodiment of the present invention;

DETAILED DESCRIPTION OF THE DRAWINGS

Figure 1:
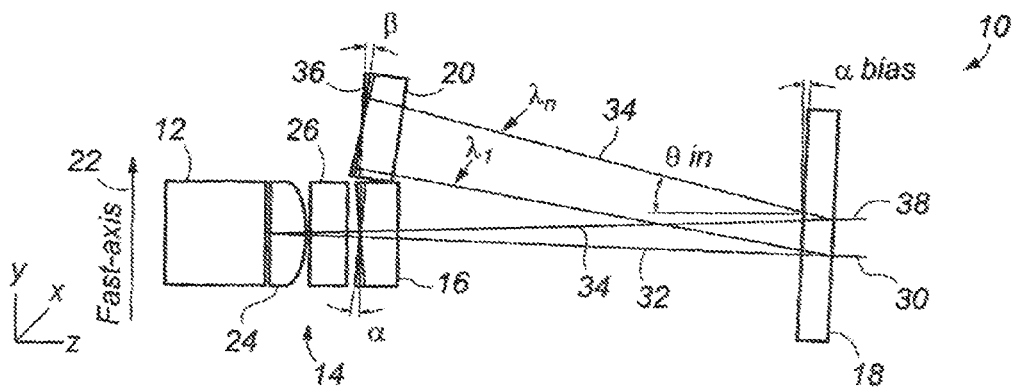
FIG. 1 is an illustration of a multi-wavelength laser array according to a first embodiment of the present invention.

Reference is initially made to FIG. 1 of the drawings which illustrates a multi-wavelength laser array, generally indicated by reference numeral 10, according to a first embodiment of the present invention. Array 10 comprises a laser diode bar 12, collimating optics indicated at 14, a first deflector 16, a volume holographic grating 18 and a second deflector 20.

Laser diode bar 12 is a standard laser diode bar, where each emitter has nominally identical properties. These are commercially available with various numbers of emitters arranged in the slow axis. The slow axis is orthogonal to the fast axis 22 which is illustrated in the Figure. In this embodiment, a fast axis collimator 24 is located adjacent to the face of the emitters. The fast axis collimator 24 is as known in the art. This may be a single element piece providing a cylindrical lens or could be a plurality of lenses fabricated on a suitable substrate.

The slow axis collimator 26, located downstream of the fast axis collimator 24, is more typically a set of lenses arranged with respect to each emitter. The set of lenses may be formed as a single monolithic array. The slow axis collimator 26 and fast axis collimator 24 together provide a collimator unit 14, which collimates and directs all the beams of the separate emitters in a first direction 30. The collimators may include smile and/or wavefront compensation.

The beam 32 from the first emitter passes through a first deflector 16. Deflector 16 comprises an array of prisms on a phaseplate. Each prism is arranged with respect to each emitter of the diode bar 12 so that a beam 32 incident upon the prism will be directed with respect to the first direction from the deflector 16. In particular, each emitter is deflected by a different angle. That is the beams will each travel at a different angle to the z axis.

The next component in the laser array is a volume holographic grating 18. Volume holographic grating 18 is a uniform reflective volume holographic grating. The orientation of the volume holographic grating is purposefully misaligned to produce a diffracted beam that is not parallel to the incident beam. The misalignment angle $\alpha$ of the volume holographic grating is a tilt angle, with respect to the first direction.

The final component in the array is the second deflector 20. Deflector 20 can be considered as a reflector since a back surface 36 is mirrored to provide total reflection of any beam, passing through the deflector 20. Deflector 20 also has a phaseplate and an array of prisms, arranged thereon. The arrangement is determined by the location of a beam reflected from the volume holographic grating with respect to each emitter. The mirrored surface 36 and the deflector 20 provide total reflection of an incoming beam so that the beam is exactly counter propagated through its original path back through grating 18, first deflector 16, collimator unit 14 and into the originating emitter in laser diode bar 12. This is a feedback system, which provides an external cavity to each emitter and its associated gain medium inside the laser bar 12. It is the tilt of the volume holographic grating together with the angle of incidence of the beams 32,34 from each emitter that determines the wavelength tuning for each emitter in the bar.

This wavelength tuning is achieved by the known principle in that by varying the angle of incidence of a beam on a volume holographic grating the central wavelength of the grating is varied and it is this central wavelength on which each emitter is so tuned.

Figure 2:
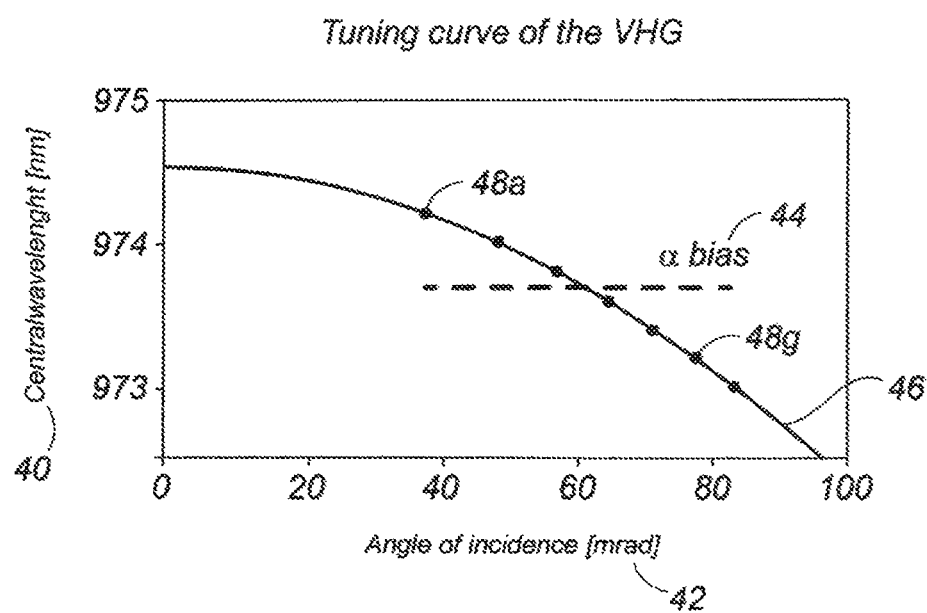
FIG. 2 is a graph of central wavelength against angle of incidence for a uniform reflective volume holographic grating.

FIG. 2 illustrates a typical tuning curve for a reflective volume holographic grating. On the horizontal axis the angle of incidence in milliradians is provided. On the vertical axis, this example shows that the central wavelengths are tuned on a range of 973 to 975 nm. The tilt angle $\alpha$ of the grating 18 is also provided at the dotted line intersecting the tuning curve 46. From such a curve 46 points, 48*a* to 48*g*, will provide suitable stepped wavelengths for a laser bar 12 having seven emitters. Thus, say, by ensuring that a beam from an emitter is incident upon the grating at 38 milliradians such an emitter can be locked to a wavelength of 974.2 nm. If a second beam is incident at a slightly greater angle of incidence, the second beam is tuned to a different lower wavelength.

The prisms on the deflector 16 are designed to ensure that the beam from each emitter will be incident on the grating 18 at a desired angle for a distinct wavelength from each emitter. Equally, on reflection from the grating, each beam will be at a different angle to the first direction 30 in the fast axis as compared to the other beams from each of the other emitters. Accordingly, prism surfaces in deflector 20 are designed to ensure each beam is reflected entirely back upon itself so that the beam passes back through the exact same path to its original emitter on laser bar 12.

Each emitter provides a beam having a portion reflected from the volume holographic grating 18 and a further or remaining portion which passes through the grating 18 to be transmitted as an output 38. The laser array 10 will therefore provide outputs 38 equal to the number of emitters in the laser bar 12 with each output 38 being a beam having a wavelength selected by its angle of incidence on the grating 18. Each output 38 will be a different wavelength from neighbouring emitters/beams and thus a collection of beams of multi-wavelength is achieved from the laser array 10. The embodiment in FIG. 1 provides a diode laser bar where each emitter is stabilised to a different wavelength. Stabilisation of emitters uses a single volume holographic grating 18 and the output wavelengths are in stepped increments that make them suitable for subsequent wavelength division multiplexing.

Each of the deflectors 16, 20 is preferably a machined monolithic substrate. The substrate is cut on one surface to define angles of the prisms. Such machining also allows micro lenses to be located upon each deflector. In this case, deflector 20 is preferentially given a weak cylindrical lens to assist in collimating the return beam back to the emitter and reducing its divergence.

While this description has considered a different angle of incidence for each emitter on the laser bar 12, it will be appreciated that where a large number of emitters are used with a small pitch and high fill factor, a stepped wavelength output is also achievable if the bar of emitters is split into subgroups of emitters such that the emitters within each group are locked to the same wavelength. For example, a bar of 49 emitters could be split into seven groups of seven emitters. Such an arrangement provides a small angle of spread and reduces the cutting depth of the phaseplate in deflector 16. It also provides a smaller beam spread at the phaseplate of deflector 20.

Additionally, the distance of the grating 18 from the laser bar 12 and its tilt must be considered so that the tilt is large enough to ensure that the beams which are reflected by the VHG do not hit the collimating optics 14. The distance must be large enough to avoid the beam hitting the collimator optics, but small enough to produce a reasonably small beam spread at the deflector 20. As the deflector 20 must compensate for the tilt on the grating 18, the deflector 20 may be arranged with its own tilt angle from the fast axis as shown in FIG. 1.

The arrangement of FIG. 1 has been selected to provide a short external cavity being a folded cavity with the deflectors 16,20 mounted upon each other. It will be realised that if a transmission VHG is used in place of a reflection VHG then the deflector 20 could be arranged on the opposite side of the grating 18 with an output being taken from the centre of the cavity. Such an arrangement would provide a longer apparatus, and the arrangement of beam combining optics would require detailed placement within the cavity. In the present arrangement the beam combining optics can be arranged separately on the outside of the array following the output beams exit from the grating 18.

Figure 3:
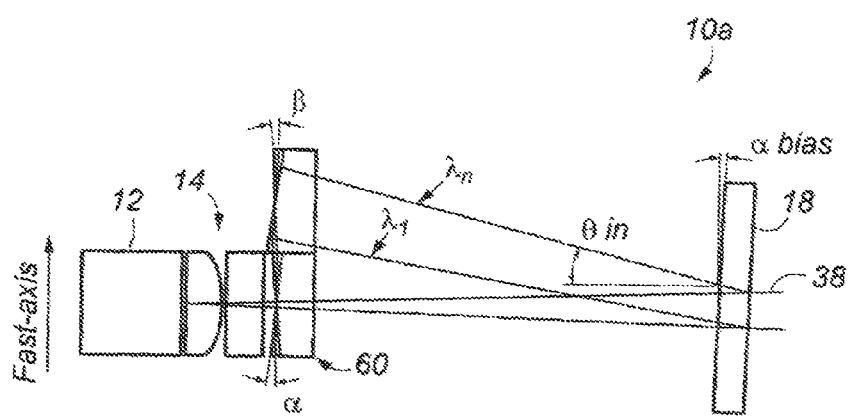
FIG. 3 is an illustration of a multi-wavelength laser array according to a further embodiment of the present invention.

Reference is now made to FIG. 3 of the drawings, which illustrates the laser array of FIG. 1 excepting that the deflectors 16, 20 are combined into a single plate 60. In the Figure, like parts to those of FIG. 1 have been given the same reference numeral to aid clarity. The laser array of FIG. 3 performs in an identical manner to the arrangement in FIG. 1. However, construction is made simpler by having a single optical component for alignment between the collimator unit 14 and the grating 18.

While FIGS. 1 and 3 have illustrated a laser array formed from a laser diode bar 12 where the emitters are arranged on the slow axis it will be apparent to those skilled in the art that the arrangement could equally be used on a laser diode stack considering the emitters in the fast axis. The emitters of each diode bar would have the same angle of incidence on the grating. Wavelength locking would occur to a single wavelength for each bar with multiple wavelengths provided by the number of bars in the stack. An alternative arrangement for a stack is provided in FIG. 4.

Figure 4:
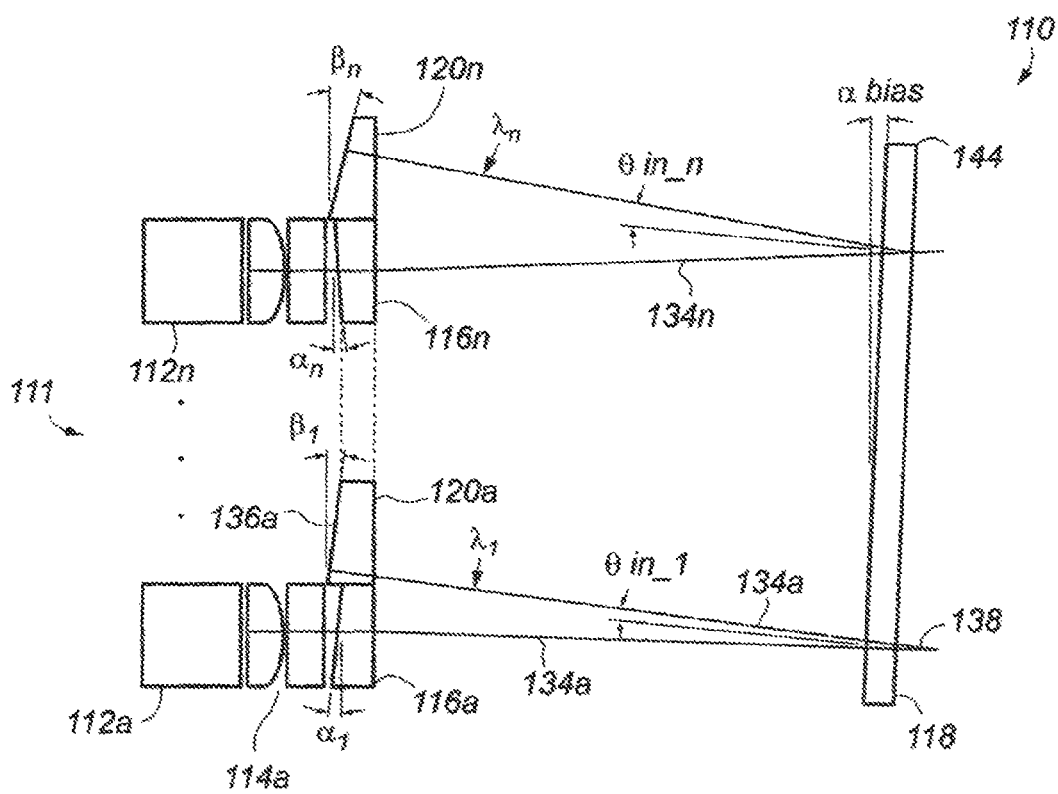
FIG. 4 is an illustration of a multi-wavelength laser array for a diode stack according to an embodiment of the present invention.

Referring now to FIG. 4 there is illustrated a multi-wavelength laser array generally indicated by reference numeral 110, according to a further embodiment of the present invention. Like parts to those of FIG. 1 have been given the same reference numeral with the addition of 100 to aid clarity. In the embodiment of FIG. 4, laser array 110 comprises a stack 111 of laser bars 112a-n. Each diode bar 112 is an identical bar having the same number of emitters and the bars are arranged on top of each other into the stack 111. For each laser bar 112a-n there are collimating optics 114a-n, as described previously to provide an array of collimated beams one from each emitter to be incident upon deflector 116a-n. Deflector 116a-n is a prism arranged to deflect the angle of each beam 134a-n from the emitters in the first direction upon a single volume holographic grating 118. It is noted that the prism deflects all the emitters for a specific laser bar at the same angle.

Each beam 134a-n is reflected upon the grating, and the angle of incidence, together with the tilt 114 of the grating 118 provide a reflected beam towards second deflector 120a-n. The second deflector 120a-n has a mirrored back surface 136a-n and is itself a prism. Each deflector 120a-n is arranged such that the beam reflected from the surface 136a-n returns to the emitter by the same path as the original beam 134a-n. An external cavity is thus created with each emitter being locked to a central wavelength determined by the angle of incidence. This arrangement is repeated for each laser diode bar 112a-n in the stack 111. However, each deflector 116a-n and 120a-n will be modified to provide a different angle of incidence unique to its respective laser bar 112.

Accordingly, in the array 110 each bar is locked to one wavelength and multi-wavelengths are produced by the combination of output beams 138a-n from each bar. This arrangement is provided in a folded configuration where the deflectors 116,120 are arranged upon each other in the array 110. The reflecting deflectors 120a-n are located between the bars of the stack. This provides a compact system.

Alternatively, each deflector 116a-n can apply a different deflection to each emitter in a single bar. This can either be done with the same deflection for corresponding emitters in different bars, so that each bar is locked over the same wavelength range, or the deflections can be chosen such that each bar is locked over a different wavelength range.

It will be apparent that an arrangement similar to that shown in FIG. 4 could instead be provided by multiples of the arrangement shown in FIG. 1. In each case, the deflectors 160, 120 are required to be carefully selected and will then provide a multi-wavelength laser array formed by having multiple wavelengths on each bar and multiple wavelengths across the stack.

Alternatively, in this arrangement, each of the deflectors 116 can apply a different deflection to each emitter in a single bar. This can either be done with the same deflection for corresponding emitters in different bars, so that each bar is locked over the same wavelength range, or the deflections can be chosen such that each bar is locked over a different wavelength range.

Where multiple wavelengths are generated within a single bar, these wavelengths need not be distinct. For example, groups of emitters could be operated on a single wavelength, with the designer choosing the number of multiple wavelengths they require from the array as a whole. Alternatively, the spectra of adjacent emitters could have different centre wavelengths but be broad enough to overlap.

Figure 5:
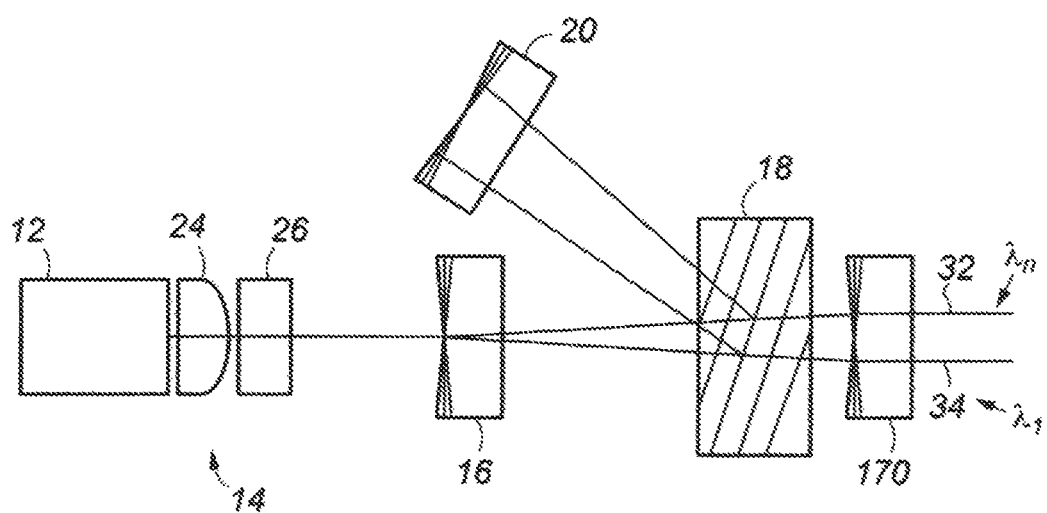
FIG. 5 is an illustration of a multi-wavelength laser array according to a further embodiment of the present invention.

Due to the arrangement of the deflectors and the volume holographic grating the output beams will be offset from the first axis. To compensate for this a third deflector is arranged after the volume holographic grating, as illustrated in FIG. 5. Like parts to those of FIG. 1 have been given the same reference numeral, to aid clarity. Indeed, with the exception of the third deflector 170, the components and operation are identical to those as described hereinbefore with reference to FIG. 1. Deflector 170 is similar to deflector 16 and directs the beams 32,34 to be parallel with the first axis. In effect, deflector 170 is removing the angular offset between the output beams 32,34. This is useful when the offset is not too large compared to the total FA of the final beam. In particular, when the bars are stacked directly or virtually, beam offsets as large as a bar pitch may be easily tolerated.

Figure 6:
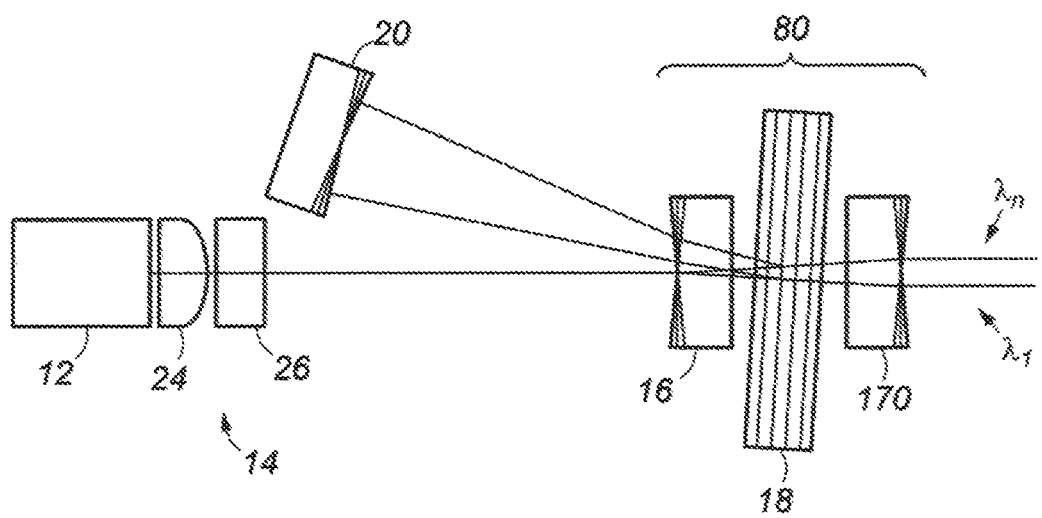
FIG. 6 is an illustration of a multi-wavelength laser array according to a further embodiment of the present invention.

Referring now to FIG. 6 of the drawings, there is illustrated a multi-wavelength laser array, having the same components as those shown in FIG. 5 as according to a further embodiment of the present invention. In this arrangement the first deflector 16 has been moved away from the collimator optics 14 and located along the first axis at the volume holographic grating 18. By bringing the deflector 16 immediately before the volume holographic grating 18, the spatial offset of the beams is minimised. Additionally, the first deflector 16, volume holographic grating 18 and third deflector 170 can be produced as a single pre-aligned optical assembly 80, making assembly and alignment of the final system easier.

To make useful applications of the multi-beam output from the array 10, 110 suitable beam combining optics are required. In the present invention it will be appreciated that the outputs 38,138 produced via the grating 18,118 provide a wide angular spread determined by the angle of incidence of the beams upon the grating 18,118.

Referring now to FIG. 7, a suitable compensation system is shown in the form of third and fourth deflectors 170,172. This indicates how compensation can be made for the angular spread. In FIG. 7 diode bar 12 is indicated and illustrated both in the fast axis, FIG. 7(a), and the slow axis, FIG. 7(b), these being the side and top views respectively. In the slow axis the beams are collimated in the collimating unit 14 of the fast axis collimator and the slow axis collimator. The deflectors 16,20 together with the grating 18 and compensation deflectors 170,172 merely maintain collimation of the beam in this axis. Thus the beam remains collimated and in the first direction.

Now referring to the side view, FIG. 7(a), the beams 134 are angled on exit from the deflector 16. As they pass through the grating 18, we now have a plurality of output beams 138, one for each emitter in the laser bar 12, which exit the grating 18 at various angles.

With respect to the fast axis, an especially machined deflector 170 intercepts the output 138. Deflector 170 comprises an array of micro prisms and micro lenses to collimate the outputs 138 and bring them to a uniform beam 139 through deflector 172. The output 141 represents a collimated array of beams at multi-wavelengths which can be combined by standard combination optics. Such combination optics may be lenses, gratings or other arrangements known to those skilled in the art.

Figure 8:
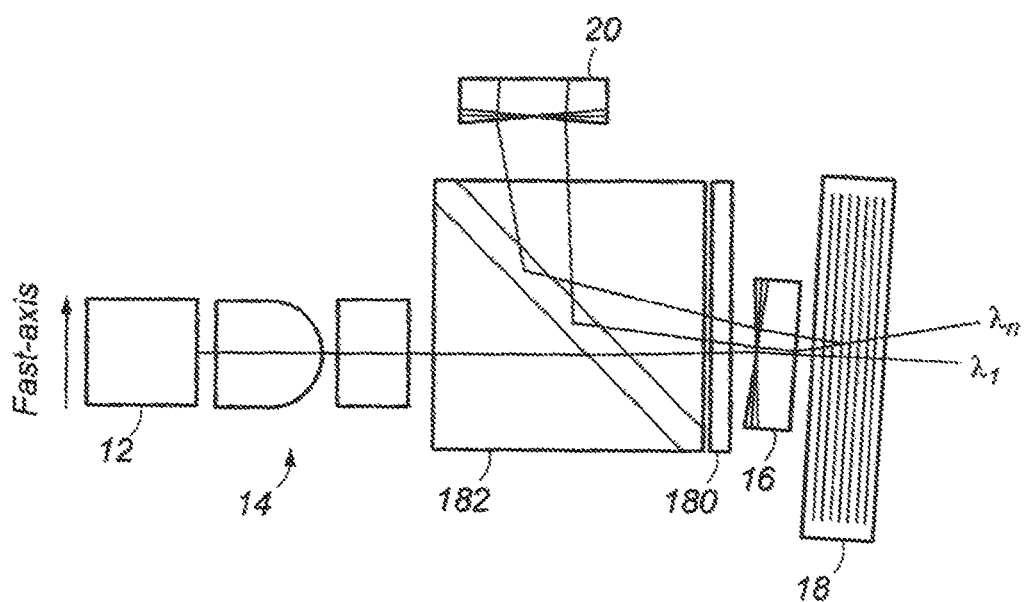
FIG. 8 is an illustration of a multi-wavelength laser array according to a further embodiment of the present invention.

A further compensation system is illustrated in FIG. 8. Like parts to those of FIG. 1 have been given the same reference numerals to aid clarity. The array comprises a laser diode bar 12, collimating optics 14, a first deflector 16, a volume holographic grating 18 and a second deflector 20, all as described hereinbefore. However, the array now also includes a quarter-wave plate 180 and a polarising beam splitter 182.

In the previous embodiments, it is desirable to minimise the reduced distance from the laser diode bar 12 to the second deflector 20. However, this requires a compromise as such positioning causes conflicts with the other requirements imposed by the geometry. The system of FIG. 8 overcomes this by locating a quarter-wave plate 180 and a polarising beam splitter 182 combination between the collimating optics 14 and the first deflector 16. Now the beam 32,34 reflected from the volume holographic grating 18, passes back through the first deflector 16, through the quarter-wave plate 180 and is reflected through approximately ninety degrees by the polarising beam splitter 182 towards the second deflector 20. Advantageously the second deflector 20 is located in parallel to the first axis at the output face of the polarising beam splitter 182. As described previously, the second deflector 20 reflects the beams 32,34 back along the same path to the emitters in the laser diode bar stack 12. This arrangement provides a very compact multi-wavelength diode laser array.

Figure 9A:
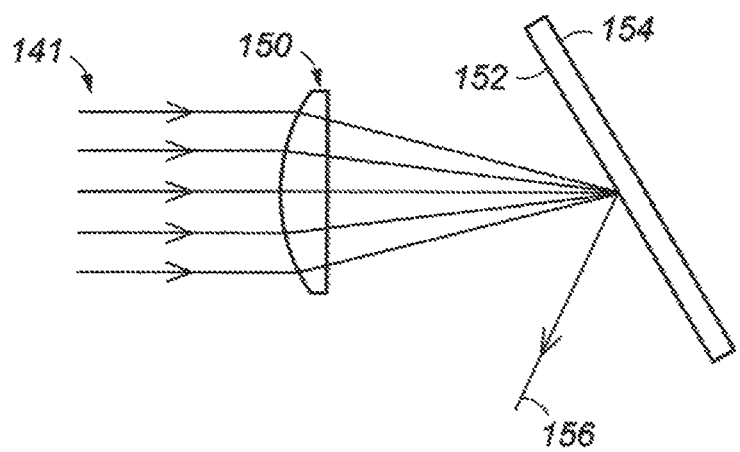
FIGS. 9(a)-(c) illustrate optical arrangements for wavelength multiplexing.
Figure 9B:
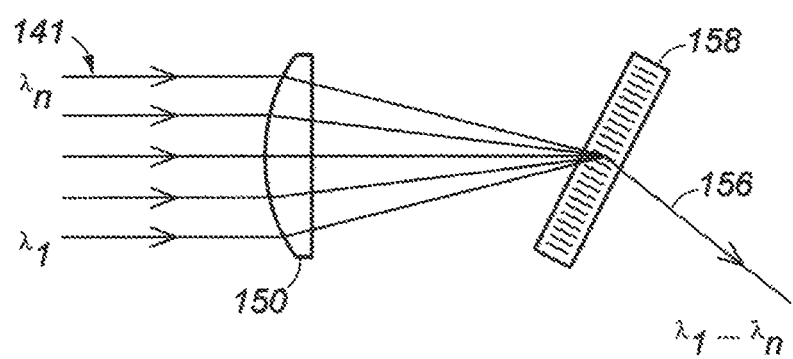
Figure 9C:
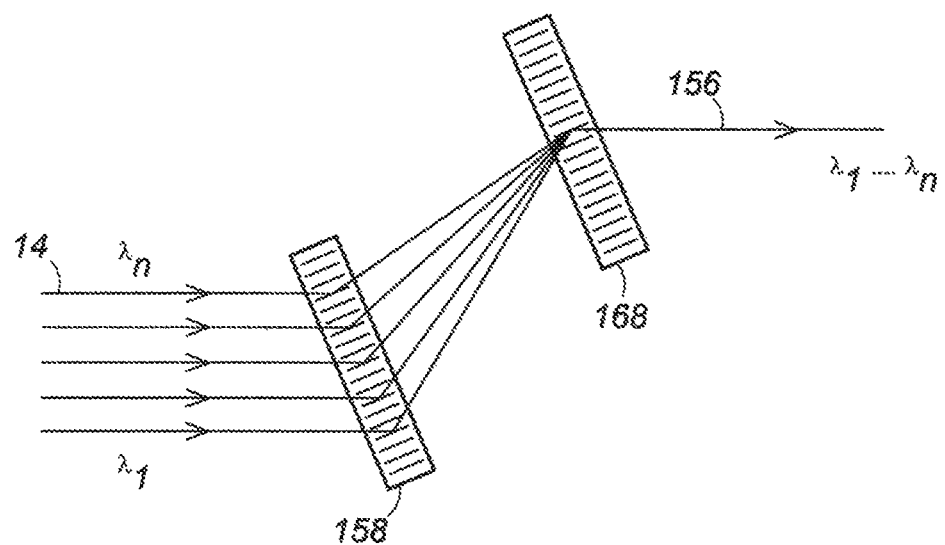

For completeness, example arrangements for wavelength multiplexing are illustrated in FIGS. 9(a),(b),(c). Initially considering FIG. 9(a), the output 141 of a collimated array of multi-wavelength beams is passed through a cylindrical lens 150. The beams 141 are arranged to converge on the surface 152 of a grating 154. Grating 154 is a uniform grating, providing a combined beam 156 of multi-wavelengths. In FIG. 9(b), the output 141 passes through the cylindrical lens 150 and converges on a tilted transmission volume holographic grating 158 to provide the combined beam 156 of multi-wavelengths. A more advantageous arrangement is illustrated in FIG. 9(c). The output 141, of a collimated array of multi-wavelength beams, is directed at a tilted transmission volume holographic grating 158. The resultant converging array of multi-wavelength beams is arranged to converge on a second transmission volume holographic grating 168 to provide the combined beam 156 of multi-wavelengths.

Figure 10:
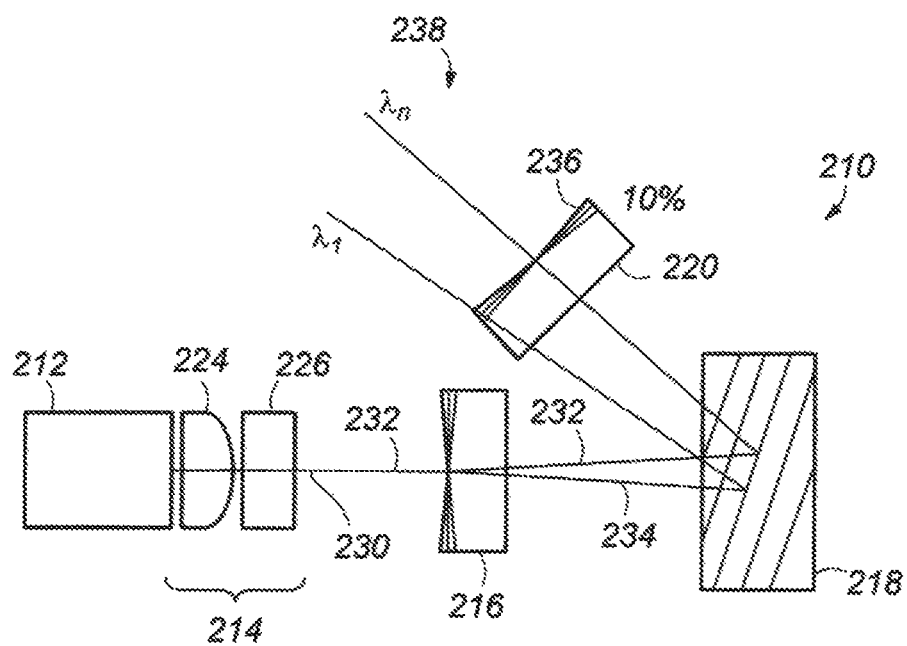
FIG. 10 is an illustration of a multi-wavelength laser array according to a second embodiment of the present invention.

Reference is now made to FIG. 10 of the drawings which illustrates a multi-wavelength laser array, generally indicated by reference numeral 210, according to a second embodiment of the present invention. Array 210 comprises a laser diode bar 212, collimating optics indicated at 214, a first deflector 216, a volume holographic grating 218 and a second deflector 220 including a partially reflective surface 236.

Laser diode bar 212 is a standard laser diode bar. These are commercially available with various numbers of emitters arranged in the slow axis. In this embodiment, a fast axis collimator 224 is located adjacent to the face of the emitters. The fast axis collimator 224 is as known in the art. This may be a single element piece providing a cylindrical lens or could be a plurality of lenses machined on a suitable substrate.

The slow axis collimator 226, located downstream of the fast axis collimator 224, is more typically a set of lenses arranged with respect to each emitter. The set of lenses may be formed as a single monolithic array. The slow axis collimator 226 and fast axis collimator 224 together provide a collimator unit 214, which collimates and directs all the beams of the separate emitters in a first direction 230. The first direction is orthogonal to the fast and slow axis.

The beam 232 from the first emitter passes through a first deflector 216. Deflector 216 comprises an array of prisms on a phaseplate. Each prism is arranged with respect to each emitter of the diode bar 212 so that a beam 232 incident upon the prism will be directed with respect to the first direction 230 from the deflector 216. In particular, each emitter beam is deflected by a different angle. That is the beams will each travel at a different angle to the z axis. The z axis being orthogonal to the fast and slow axis.

The next component in the laser array is a volume holographic grating 218. Volume holographic grating 218 is a uniform reflective volume holographic grating with high reflectivity. This reflectivity should be greater than 90% and would ideally be 100%. The orientation of the volume holographic grating is purposefully misaligned to produce a diffracted beam that is not parallel to the incident beam. The misalignment angle $\alpha$ of the volume holographic grating is a tilt angle, with respect to the first direction.

The final component in the array is the second deflector 220. Deflector 220 can be considered as an output coupler since a back surface 236 is mirrored to provide partial reflection of any beam, typically 10% reflection and 90% transmission, passing through the deflector 220. Deflector 220 also has a phaseplate and an array of prisms, arranged thereon. The arrangement is determined by the location of the beam totally reflected from the volume holographic grating with respect to each emitter. The mirrored surface 236 of the deflector 220 provides reflection of a portion of an incoming beam so that the beam is counter propagated through its original path back through grating 218, first deflector 216, collimator unit 214 and into the originating emitter in laser diode bar 212. This is a feedback system, which provides an external cavity to each emitter and its associated gain medium inside the laser bar 212. It is the tilt of the volume holographic grating 218 together with the angle of incidence of the beams 232, 234 from each emitter that determines the wavelength tuning for each emitter in the bar.

This wavelength tuning is achieved by the known principle in that by varying the angle of incidence of a beam on a volume holographic grating the central wavelength of the grating is varied and it is this central wavelength on which each emitter is so tuned. FIG. 2 illustrates a typical tuning curve for a reflective volume holographic grating.

The prisms on the deflector 216 are designed to ensure that the beam from each emitter will be incident on the grating 218 at a desired angle for a distinct wavelength from each emitter. Equally, on reflection from the grating, each beam will be at a different angle to the first direction 230 in the fast axis as compared to the other beams from each of the other emitters. Accordingly, prism surfaces in deflector 220 are designed to ensure each beam is reflected entirely back upon itself so that the beam passes back through the exact same path to its original emitter on laser bar 212.

Each emitter provides a beam which is totally reflected by the volume holographic grating 218 towards the second deflector 220. At the second deflector 220 a majority of the beam is transmitted as the output 238 of the array 210 while a portion is fed-back into the laser diode bar 212 to lock wavelengths. The laser array 210 will therefore provide outputs 238 equal to the number of emitters in the laser bar 212 with each output 238 being a beam having a wavelength selected by its angle of incidence on the grating 218. Each output 238 will be a different wavelength from neighbouring emitters/beams and thus a collection of beams of multi-wavelength is achieved from the laser array 210. The embodiment in FIG. 10 provides a diode laser bar where each emitter is stabilised to a different wavelength. Stabilisation of emitters uses a single volume holographic grating 218 and the output wavelengths are in stepped increments that make them suitable for subsequent wavelength division multiplexing.

Each of the deflectors 216, 220 is preferably a machined monolithic substrate. The substrate is cut on one surface to define angles of the prisms. Such machining also allows micro lenses to be located upon each deflector. In this case, deflector 220 is preferentially given a weak cylindrical lens to assist in collimating the return beam back to the emitter and reducing its divergence.

While this description has considered a different angle of incidence for each emitter on the laser bar 212, it will be appreciated that where a large number of emitters are used with a small pitch and high fill factor, a stepped wavelength output is also achievable if the bar of emitters is split into subgroups of emitters such that the emitters within each group are locked to the same wavelength. For example, a bar of 49 emitters could be split into seven groups of seven emitters. Such an arrangement provides a small angle of spread and reduces the cutting depth of the phaseplate in deflector 216. It also provides a smaller beam spread at the phaseplate of deflector 220.

Additionally, the distance of the grating 218 from the laser bar 212 and its tilt must be considered so that the tilt is large enough to ensure that the beams which are reflected by the volume holographic grating 218 do not hit the collimating optics 214. The distance must be large enough to avoid the beam hitting the collimator optics, but small enough to produce a reasonable small beam spread at the deflector 220. As the deflector 220 must compensate for the tilt on the grating 218, the deflector 220 may be arranged with its own tilt angle from the fast axis as shown in FIG. 10.

The arrangement of FIG. 10 has been selected to provide a short external cavity being a folded cavity with the deflectors 216,220 mounted upon each other. In an earlier embodiment using a reflective volume holographic grating where the grating provides less than 100% diffraction efficiency (DE) and feedback passes through the grating twice, the maximum power available for feedback is $DE^2$. The actual feedback into the laser waveguide of each emitter is lower, due to transmission losses, misalignments and beam spreading. This means, for example, that if 4% power in the return beam is needed, a DE of 20% is needed which incurs significant losses. In particular 16% of the power is directly dumped. In the present embodiment, by using a 100% DE volume holographic grating, it is the reflectivity of the second deflector acting as an output coupler that determines the power in the feedback beam. In the example given, to get 4% feedback power, only 4% reflectivity is required, so losses are far lower.

Figure 11:
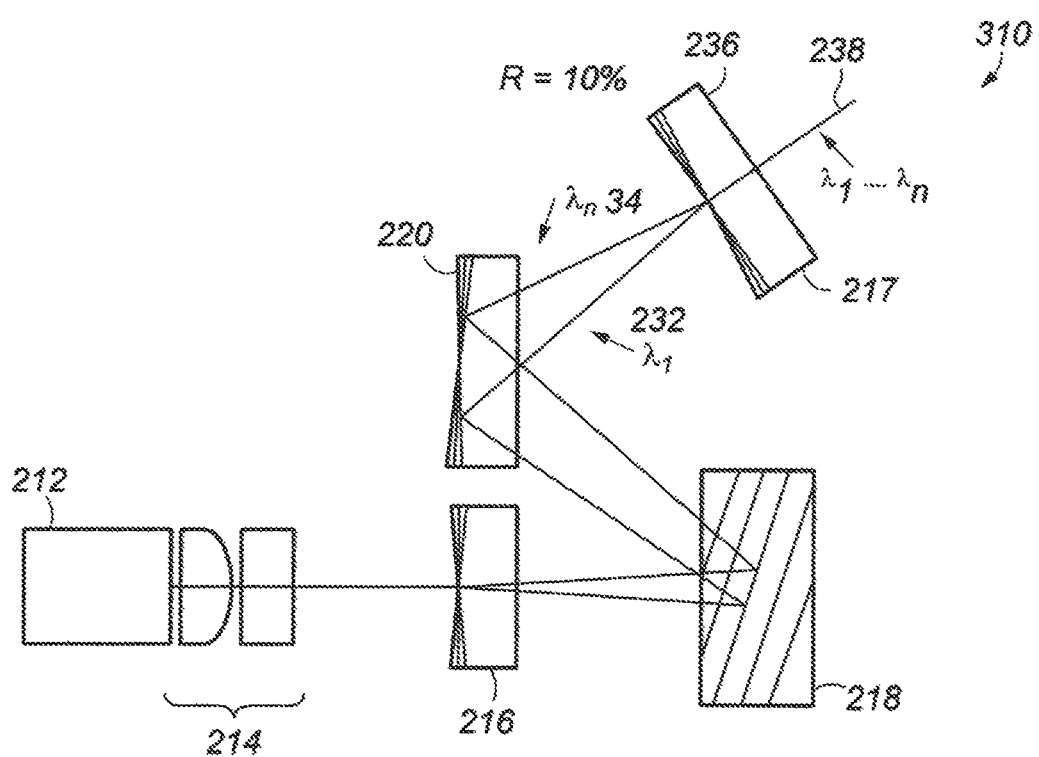
FIG. 11 is an illustration of a multi-wavelength laser array according to a further embodiment of the present invention.

Reference is now made to FIG. 11 of the drawings, which illustrates a multi-wavelength laser array, generally indicated by reference numeral 310, according to a further embodiment of the present invention. Like parts to those of FIG. 10 have been given the same reference numerals to aid clarity. In this embodiment a third deflector 217 is positioned after the second deflector 220, and the second deflector 220 now includes a totally reflective mirrored back surface. The partially reflective surface 217 used to provide the feedback beam is provided on the third deflector 217. This arrangement provides the same advantages in reduction in losses as for the embodiment of FIG. 10. Additionally, the third deflector 217 can be arranged such that the beams 232, 234 are collimated as they output the array 310, thus producing a multi-wavelength output which is suitable for multiplexing.

Figure 12:
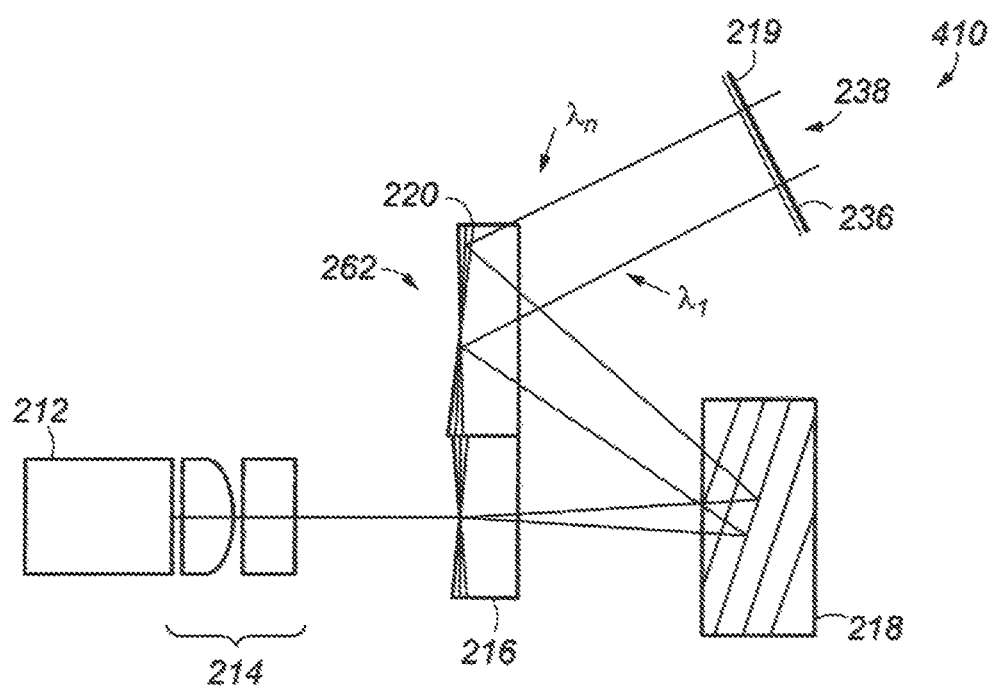
FIG. 12 is an illustration of a multi-wavelength laser array according to a further embodiment of the present invention.

Reference is now made to FIG. 12 of the drawings which illustrates a multi-wavelength laser array, generally indicated by reference numeral 410, according to a further embodiment of the present invention. Like parts to those of FIG. 11 have been given the same reference numeral to aid clarity. In this embodiment the first and second deflectors 216, 220 are combined into a single plate 262. Additionally the partially reflective surface 236 is provided on a standard output coupler 219. The laser array 210 of FIG. 12 performs in an identical manner to the arrangement in FIG. 11 with the beams now spread on exit from the second deflector 220. However, construction is made simpler by having a single optical component for alignment between the collimator unit 214 and the grating 218.

Figure 13:
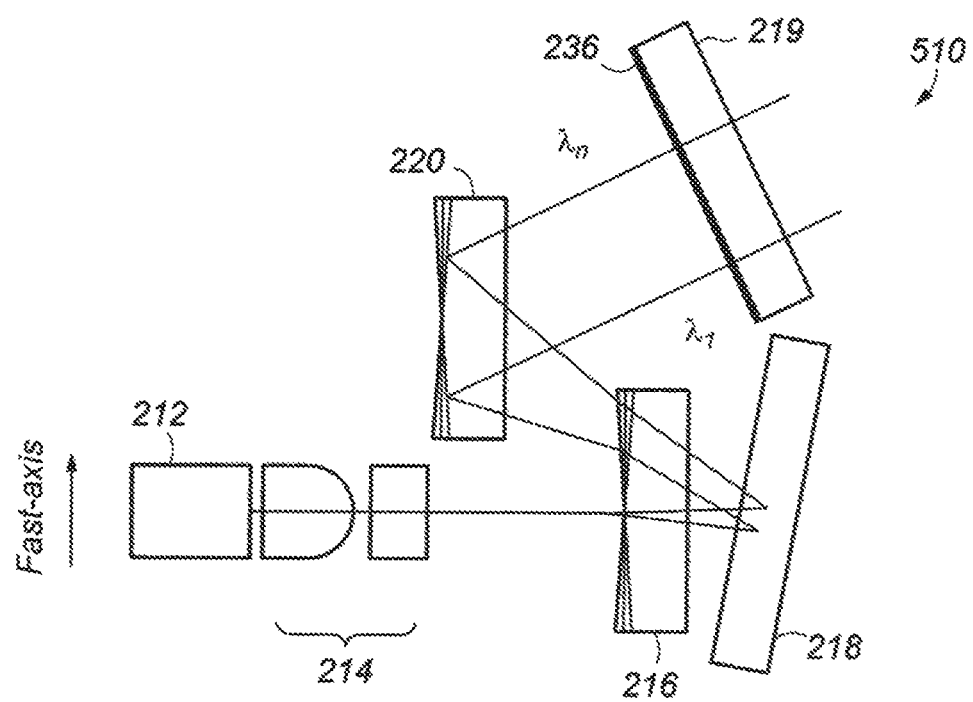
FIG. 13 is an illustration of a multi-wavelength laser array according to a further embodiment of the present invention.

Reference is now made to FIG. 13 of the drawings which illustrates a multi-wavelength laser array, generally indicated by reference numeral 510, according to a further embodiment of the present invention. Like parts to those of FIGS. 11 and 12 have been given the same reference numeral to aid clarity. In this embodiment, the first deflector 216 is moved away from the collimator optics 214 and located along the first axis at the volume holographic grating 218. By bringing the first deflector 216 immediately before the volume holographic grating 218, the spatial offset of the beams is minimised. This arrangement is therefore shown with the beam now making a double pass of the first deflector 216. Additionally, the first deflector 216 and volume holographic grating 218 can be produced as a single pre-aligned optical assembly, making assembly and alignment of the final system easier.

While FIGS. 10 to 13 have illustrated a laser array 210, 310,410,510 formed from a laser diode bar 212 where the emitters are arranged on the slow axis it will be apparent to those skilled in the art that the arrangement could equally be used on a laser diode stack considering the emitters in the fast axis. The emitters of each diode bar would have the same angle of incidence on the grating. Wavelength locking would occur to a single wavelength for each bar with multiple wavelengths provided by the number of bars in the stack. For example, a laser array could comprise a stack of laser bars. Each diode bar is an identical bar having the same number of emitters and the bars are arranged on top of each other into the stack. For each laser bar there are collimating optics, as described previously to provide an array of collimated beams one from each emitter to be incident upon the first deflector. The first deflector is a prism arranged to deflect the angle of each beam from the emitters in the first direction upon a single volume holographic grating. It is noted that the prism deflects all the emitters for a specific laser bar at the same angle.

Each beam is totally reflected upon the grating, and the angle of incidence, together with the tilt of the grating provide a reflected beam towards a second deflector. The second deflector has a mirrored back surface providing partial reflection and is itself a prism. Each second deflector is arranged such that the beam reflected from the back surface of the second deflector returns to the emitter by the same path as the original beam. An external cavity is thus created with each emitter being locked to a central wavelength determined by the angle of incidence. This arrangement is repeated for each laser diode bar in the stack. However, each deflector will be modified to provide a different angle of incidence unique to its respective laser bar.

Accordingly, in this array each bar is locked to one wavelength and multi-wavelengths are produced by the combination of output beams from each bar. This arrangement is provided in a folded configuration where the deflectors 11 are arranged upon each other in the array. The second deflectors are located between the bars of the stack. This provides a compact system.

Alternatively, each first deflector can apply a different deflection to each emitter in a single bar. This can either be done with the same deflection for corresponding emitters in different bars, so that each bar is locked over the same wavelength range, or the deflections can be chosen such that each bar is locked over a different wavelength range.

It will be apparent that a similar arrangement could be provided by multiples of the arrangement shown in FIG. 10. In each case, the deflectors are required to be carefully selected and will then provide a multi-wavelength laser array formed by having multiple wavelengths on each bar and multiple wavelengths across the stack.

Alternatively, in this arrangement, each of the deflectors can apply a different deflection to each emitter in a single bar. This can either be done with the same deflection for corresponding emitters in different bars, so that each bar is locked over the same wavelength range, or the deflections can be chosen such that each bar is locked over a different wavelength range.

Where multiple wavelengths are generated within a single bar, these wavelengths need not be distinct. For example, groups of emitters could be operated on a single wavelength, with the designer choosing the number of multiple wavelengths they require from the array as a whole. Alternatively, the spectra of adjacent emitters could have different centre wavelengths but be broad enough to overlap.

To make useful applications of the multi-beam output from the array 210,310,410,510 suitable beam combining optics are required. In the present invention it will be appreciated that the outputs produced via the grating 218 provide a wide angular spread determined by the angle of incidence of the beams upon the grating 218. The second deflector 220 and the third deflector 217, when used, compensate for this angular spread. Thus the output 238 is provided as a collimated array of beams which can be multiplexed for insertion into a fibre or to perform other functions.

Figure 14:
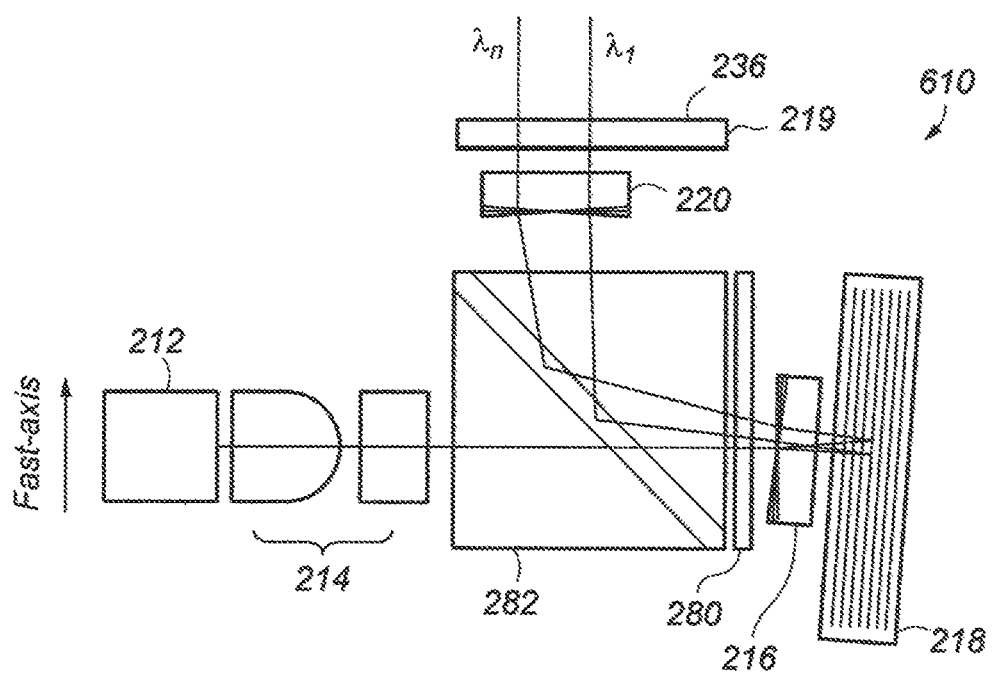
FIG. 14 is an illustration of a multi-wavelength laser array according to a further embodiment of the present invention.

Referring now to FIG. 14 of the drawings, there is illustrated a multi-wavelength laser array, generally indicated by reference numeral 610, according to a further embodiment of the present invention. Like parts to those of FIG. 10 have been given the same reference numerals to aid clarity. Array 610 comprises a laser diode bar 212, collimating optics 214, a first deflector 216, a volume holographic grating 218, a second deflector 220, and an output coupler 219 including a partially reflective surface 236 all as described hereinbefore. Array 610 also includes a quarter-wave plate 280 and a polarising beam splitter 282.

In the previous embodiments of FIGS. 10 to 13 it is desirable to minimise the reduced distance from the laser diode bar 212 to the second deflector 220. However, this requires a compromise as such positioning causes conflicts with the other requirements imposed by the geometry. Array 610 overcomes this by locating a quarter-wave plate 280 and a polarising beam splitter 282 combination between the collimating optics 214 and the first deflector 216. Now the beam 232,234 reflected from the volume holographic grating 218, passes back through the first deflector 216, through the quarter-wave plate 280 and is reflected through approximately ninety degrees by the polarising beam splitter 282 towards the second deflector 220. Advantageously the second deflector 220 is located in parallel to the first axis at the output face of the polarising beam splitter 282. As described previously, the surface 236 reflects the beams 232,234 back along the same path to the emitters in the laser diode bar stack 212. Array 610 provides a very compact multi-wavelength diode laser array.

As for the embodiments of FIGS. 1 and 3 to 8, the embodiments of FIGS. 10 to 14 can include wavelength multiplexing, with examples as illustrated in FIGS. 9(*a*),(*b*),(*c*).

Figure 15:
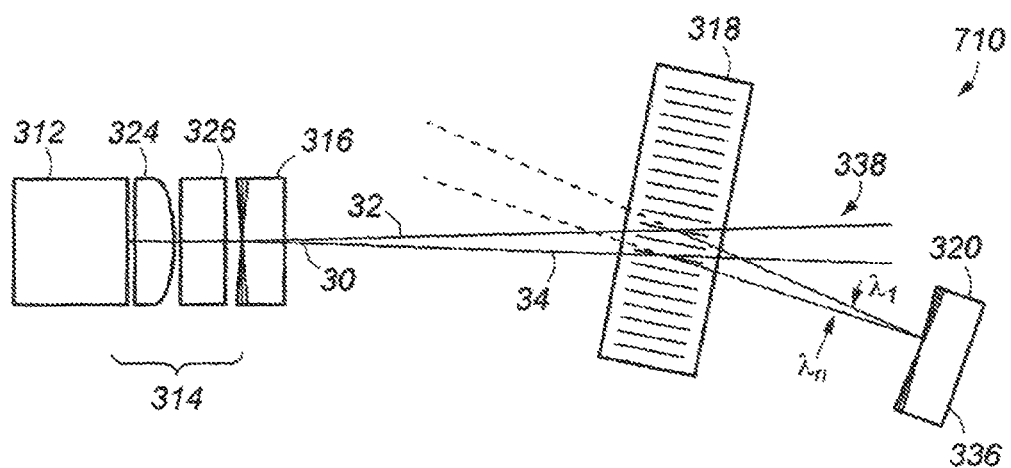
FIG. 15 is an illustration of a multi-wavelength laser array according to a third embodiment of the present invention.

Reference is now made to FIG. 15 of the drawings which illustrates a multi-wavelength laser array, generally indicated by reference numeral 710, according to a third embodiment of the present invention. Array 710 comprises a laser diode bar 312, collimating optics indicated at 314, a first deflector 316, a volume holographic grating 318 and a second deflector 320.

Laser diode bar 312 is a standard laser diode bar. These are commercially available with various numbers of emitters arranged in the slow axis. The slow axis is orthogonal to the fast axis. In this embodiment, a fast axis collimator 324 is located adjacent to the face of the emitters. The fast axis collimator 324 is as known in the art. This may be a single element piece providing a cylindrical lens or could be a plurality of lenses machined on a suitable substrate.

The slow axis collimator 326, located downstream of the fast axis collimator 324, is more typically a set of lenses arranged with respect to each emitter. The set of lenses may be formed as a single monolithic array. The slow axis collimator 326 and fast axis collimator 324 together provide a collimator unit 314, which collimates and directs all the beams of the separate emitters in a first direction 330.

The beam 332 from the first emitter passes through a first deflector 316. Deflector 316 comprises an array of prisms on a phaseplate. Each prism is arranged with respect to each emitter of the diode bar 312 so that a beam 332 incident upon the prism will be directed with respect to the first direction 330 from the deflector 316. In particular, each emitter is deflected by a different angle. That is the beams will each travel at a different angle to the z axis.

The next component in the laser array is a volume holographic grating 318. Volume holographic grating 318 is a uniform transmissive volume holographic grating. The orientation of the volume holographic grating is purposefully misaligned to produce a deflected beam that is not parallel to the incident beam. The misalignment angle of the volume holographic grating is a tilt angle, with respect to the first direction.

The final component in the array is the second deflector 320. In the embodiment shown in FIG. 15, deflector 320 can be considered as a reflector since a back surface 336 is mirrored to provide total reflection of any beam, passing through the deflector 320. Deflector 320 also has a phaseplate and an array of prisms, arranged thereon. The arrangement is determined by the location of a beam deflected from the volume holographic grating with respect to each emitter. The mirrored surface 336 and the deflector 320 provide total reflection of an incoming beam so that the beam is exactly counter propagated through its original path back through grating 318, first deflector 316, collimator unit 314 and into the originating emitter in laser diode bar 312. This is a feedback system, which provides an external cavity to each emitter and its associated gain medium inside the laser bar 312. It is the tilt of the volume holographic grating together with the angle of incidence of the beams 332,334 from each emitter that determines the wavelength tuning for each emitter in the bar.

This wavelength tuning is achieved by the known principle in that by varying the angle of incidence of a beam on a volume holographic grating the central wavelength of the grating is varied and it is this central wavelength on which each emitter is so tuned.

Figure 16:
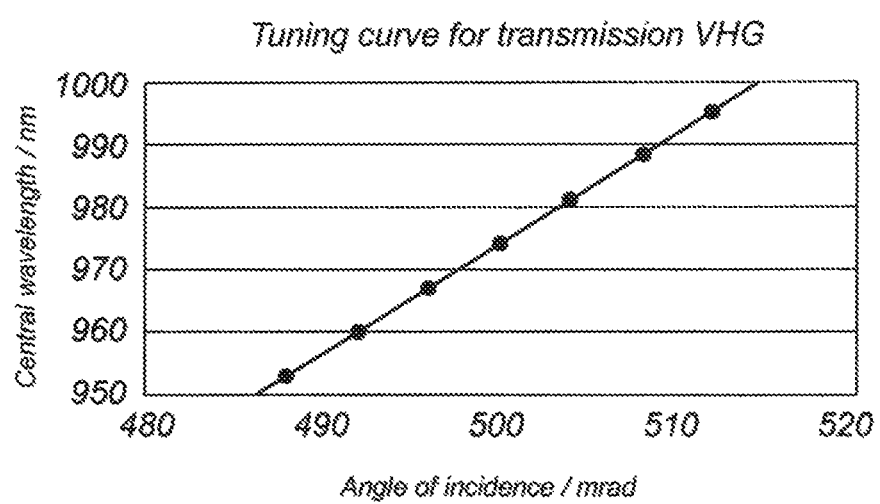
FIG. 16 is a graph of central wavelength against angle of incidence being a tuning curve for a uniform transmissive volume holographic grating.

FIG. 16 illustrates a typical tuning curve for a uniform transmissive volume holographic grating. On the horizontal axis the angle of incidence in milliradians is provided. On the vertical axis, this example shows that the central wavelengths are tuned on a range of around 955 to 995 nm. Thus a beam from an emitter incident at an angle of between 480 and 520 mrad will be tuned to the respective wavelength identified by the linear relationship as shown on the graph. Thus by deflecting the beams to be incident upon the grating 318 at different angles, each beam is tuned to a unique different wavelength.

The prisms on the deflector 316 are designed to ensure that the beam from each emitter will be incident on the grating 318 at a desired angle for a distinct wavelength from each emitter. Equally, on deflection from the grating, each beam will be at a different angle to the first direction 330 in the fast axis as compared to the other beams from each of the other emitters. Accordingly, prism surfaces in deflector 320 are designed to ensure each beam is reflected entirely back upon itself so that the beam passes back through the exact same path to its original emitter on laser bar 312.

Each emitter provides a beam having a portion deflected from the volume holographic grating 318 and a further or remaining portion which passes directly through the grating 318 to be transmitted as an output 338. This remaining portion is the result of the volume holographic grating 318 being selected to have a diffraction efficiency of less than 100%. In the embodiment shown, the diffraction efficiency will be around 10% so that approximately 10% of each beam is deflected and used as a feedback portion for tuning, while 90% forms the remaining portion which is the output 38.

The laser array 710 will therefore provide outputs 338 equal to the number of emitters in the laser bar 312 with each output 338 being a beam having a wavelength selected by its angle of incidence on the grating 318. Each output 338 will be a different wavelength from neighbouring emitters/beams and thus a collection of beams of multi-wavelength is achieved from the laser array 710. The embodiment in FIG. 15 provides a diode laser bar where each emitter is stabilised to a different wavelength. Stabilisation of emitters uses a single volume holographic grating 318 and the output wavelengths are in stepped increments that make them suitable for subsequent wavelength division multiplexing.

Each of the deflectors 316, 320 is preferably a machined monolithic substrate. The substrate is cut on one surface to define angles of the prisms. Such machining also allows micro lenses to be located upon each deflector. In this case, deflector 320 is preferentially given a weak cylindrical lens to assist in collimating the return beam back to the emitter and reducing its divergence.

While this description has considered a different angle of incidence for each emitter on the laser bar 312, it will be appreciated that where a large number of emitters are used with a small pitch and high fill factor, a stepped wavelength output is also achievable if the bar of emitters is split into subgroups of emitters such that the emitters within each group are locked to the same wavelength. For example, a bar of 49 emitters could be split into seven groups of seven emitters. Such an arrangement provides a small angle of spread and reduces the cutting depth of the phaseplate in deflector 316. It also provides a smaller beam spread at the phaseplate of deflector 320.

The arrangement of FIG. 15 has been selected to provide a short external cavity being a folded cavity with the output 338 and second deflector 320 together at one end. Accordingly, deflection angles must be calculated to ensure that deflector 320 does not overlap the path of the output 338.

In considering FIG. 15, it will be realised that if a transmission volume holographic grating with 100% diffraction efficiency is used and the reflective surface 336 is partially reflective, then the output 338 could be taken from the deflector 320. In this arrangement the surface 336 acts as an output coupler. As with traditional output couplers, the reflectivity is selected to provide sufficient power in the output while creating a feedback portion for effective tuning. By using a 100% diffraction efficiency transmissive volume holographic grating there is effectively no loss on passing through the grating.

Figure 17:
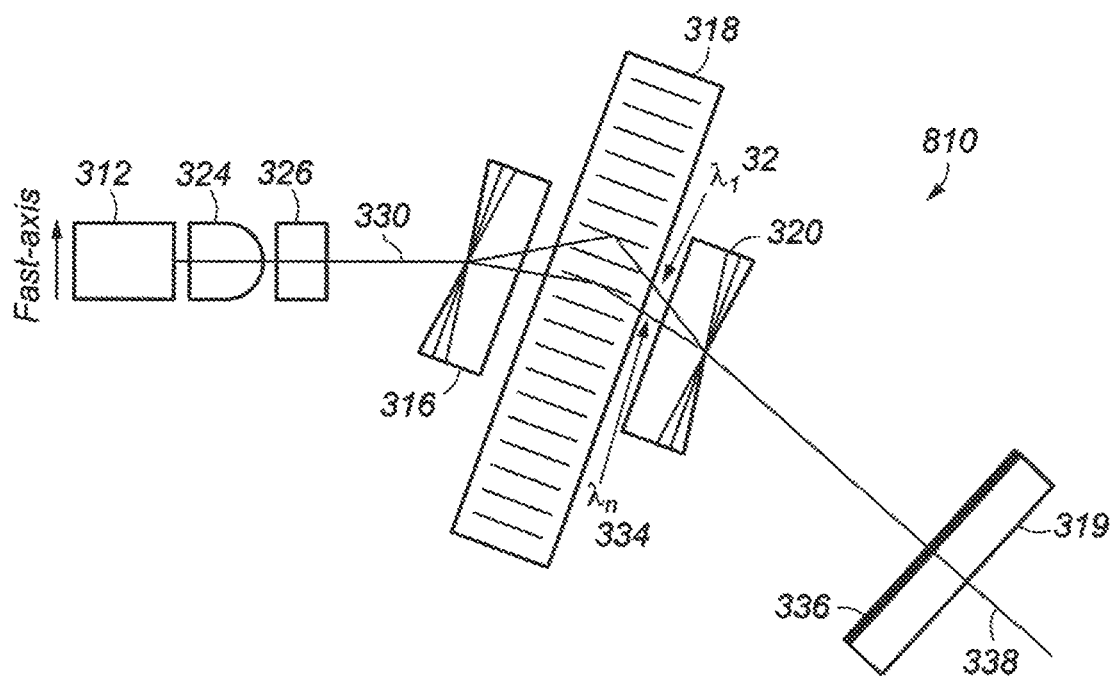
FIG. 17 is an illustration of a multi-wavelength laser array according to a further embodiment of the present invention.

Reference is now made to FIG. 17 of the drawings, which illustrates a multi-wavelength laser array, generally indicated by reference numeral 810, according to a second embodiment of the present invention. Like parts to those of FIG. 15 have been given the same reference numerals to aid clarity. This arrangement is similar to FIG. 15 with a 100% diffraction efficiency transmissive volume holographic grating and an output coupler 319. The laser array of FIG. 17 performs in an identical manner to the alternative arrangement of FIG. 15, described above, with the beams 332,334 being entirely deflected through the volume holographic grating 318. A feedback portion is provided by partial reflection from the surface 336 which is now located on a separate output coupler 319. This arrangement allows for both deflectors 316, 320 to be arranged close to the volume holographic grating 318 and so reduce dispersion. The components 316, 318, 320 could conceivably be provided as a single pre-aligned optical assembly which would simplify alignment.

Figure 18:
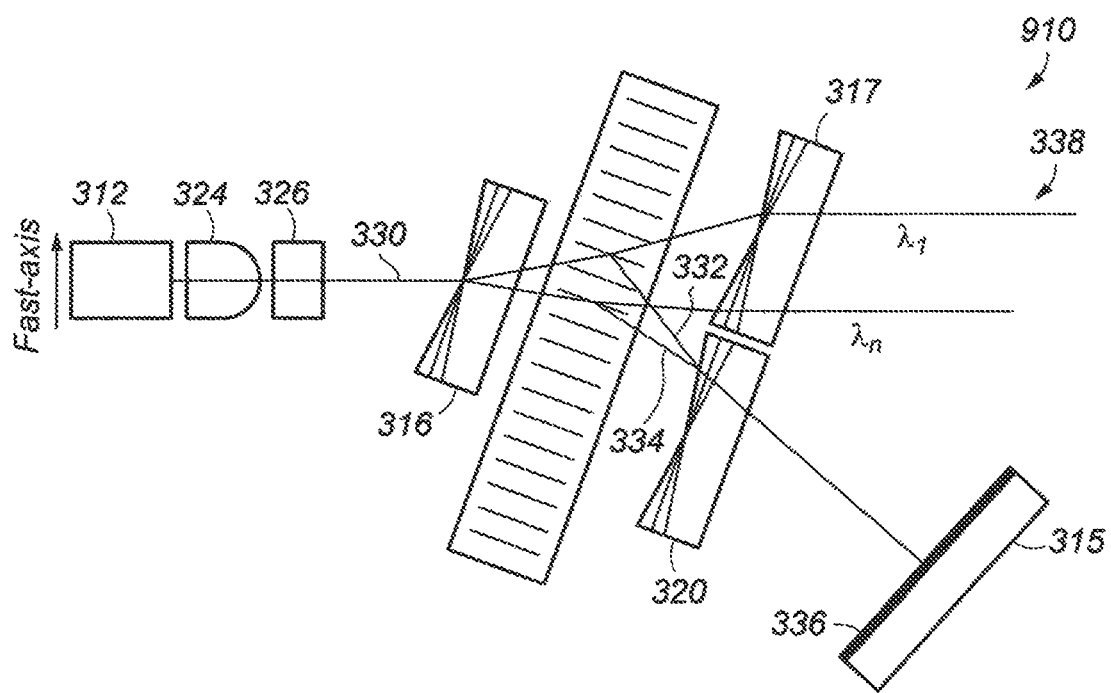
FIG. 18 is an illustration of a multi-wavelength laser array according to a further embodiment of the present invention.

Reference is now made to FIG. 18 of the drawings, which illustrates a multi-wavelength laser array, generally indicated by reference numeral 910, according to a further embodiment of the present invention. Like parts to those of FIG. 15 have been given the same reference numerals to aid clarity. This arrangement is similar to FIG. 15 with a 10% diffraction efficiency transmissive volume holographic grating 318. The reflective surface 336 which was on the back of the deflector 320 is now on a separate element 315. The laser array of FIG. 18 performs in an identical manner to the arrangement of FIG. 15, described above, with the beams 332,334 being partially deflected through the volume holographic grating 318. The feedback portion is provided by reflection from the surface 336 which is now located on a separate element 315. Additionally, this Figure includes a third deflector 317. Deflector 317 is arranged to deflect the remaining portion of the beams which pass through the volume holographic grating 318 without being deflected. This remaining portion forms the output 338 and deflection of this by the deflector 317 provides an array of beams which are separated and parallel to the first axis. These beams are then arranged ideally for multiplexing. As can be seen from the Figure, the second 320 and third 317 deflectors could be combined as a single monolithic array to aid alignment.

While FIGS. 15, 17 and 18 have illustrated a laser array 710,810,910 formed from a laser diode bar 312 where the emitters are arranged on the slow axis it will be apparent to those skilled in the art that the arrangement could equally be used on a laser diode stack considering the emitters in the fast axis. The emitters of each diode bar would have the same angle of incidence on the grating. Wavelength locking would occur to a single wavelength for each bar with multiple wavelengths provided by the number of bars in the stack. For example, a laser array could comprise a stack of laser bars. Each diode bar is an identical bar having the same number of emitters and the bars are arranged on top of each other into the stack. For each laser bar there are collimating optics, as described previously to provide an array of collimated beams one from each emitter to be incident upon the first deflector. The first deflector is a prism arranged to deflect the angle of each beam from the emitters in the first direction upon a single volume holographic grating. It is noted that the prism deflects all the emitters for a specific laser bar at the same angle.

Each beam is at least partially deflected upon the grating, and the angle of incidence, together with the tilt of the grating provide a deflected beam towards a second deflector. The second deflector is itself a prism and is arranged such that the beam reflected from the surface returns to the emitter by the same path as the original beam. An external cavity is thus created with each emitter being locked to a central wavelength determined by the angle of incidence. This arrangement is repeated for each laser diode bar in the stack. However, each deflector will be modified to provide a different angle of incidence unique to its respective laser bar.

Accordingly, in this array each bar is locked to one wavelength and multi-wavelengths are produced by the combination of output beams from each bar. This arrangement is provided in a folded configuration where the deflectors are arranged upon each other in the array. The second deflectors are located between the bars of the stack. This provides a compact system.

Alternatively, each first deflector can apply a different deflection to each emitter in a single bar. This can either be done with the same deflection for corresponding emitters in different bars, so that each bar is locked over the same wavelength range, or the deflections can be chosen such that each bar is locked over a different wavelength range.

It will be apparent that a similar arrangement could be provided by multiples of the arrangement shown in FIG. 15.

In each case, the deflectors are required to be carefully selected and will then provide a multi-wavelength laser array formed by having multiple wavelengths on each bar and multiple wavelengths across the stack.

Alternatively, in this arrangement, each of the deflectors can apply a different deflection to each emitter in a single bar. This can either be done with the same deflection for corresponding emitters in different bars, so that each bar is locked over the same wavelength range, or the deflections can be chosen such that each bar is locked over a different wavelength range.

Where multiple wavelengths are generated within a single bar, these wavelengths need not be distinct. For example, groups of emitters could be operated on a single wavelength, with the designer choosing the number of multiple wavelengths they require from the array as a whole. Alternatively, the spectra of adjacent emitters could have different centre wavelengths but be broad enough to overlap.

It will also be appreciated that the first deflector 316 can be arranged adjacent the collimator optics 314 or located along the first axis at the volume holographic grating 318. By bringing the first deflector 316 immediately before the volume holographic grating 318, the spatial offset of the beams is minimised. Additionally, the first deflector 316 and volume holographic grating 318 can be produced as a single pre-aligned optical assembly, making assembly and alignment of the final system easier.

To make useful applications of the multi-beam output from the array 710,810,910 suitable beam combining optics are required. In these embodiments it will be appreciated that the outputs produced via the grating 318 provide an angular spread to the output 338. The second deflector 320 and/or the third deflector 317, when used, in the output path compensate for this angular spread. Thus the output 338 is provided as a collimated array of beams which can be multiplexed for insertion into a fibre or to perform other functions.

As for the embodiments of FIGS. 1, 3 to 8, and 10 to 14 the embodiments of FIGS. 15, 17 and 18 can include wavelength multiplexing, with examples as illustrated in FIGS. 9(a),(b), (c).

Previously, we discussed the ability to provide a multi-wavelength array of stepped wavelengths. It will be apparent that the multi-wavelength output can be continuous, depending on the number of emitters and the range of available angles and wavelengths in the spectral width of a single wavelength locked emitter. By this selection, the spectra of adjacent emitters can be made to overlap or can be resolved. In overlapping the adjacent emitters continuous multi-wavelength variation is attainable. This provides increased brightness, which may be desired for some applications.

In a further embodiment we can further reduce the number optical elements to be aligned in the array. The fast axis collimator and slow axis collimator can be combined in a single monolithic element, and thus a further optical element is removed from the arrangement. This also provides the opportunity for the first deflector to be located closer to the emitter array if desired. Alternatively, particularly for laser arrays having a fast axis collimator attached at their output, the slow axis collimator can be combined with the first deflector. Again this reduces the number of optical elements and allows the first deflector to be located closer to the emitter array if desired. Smile compensation and/or wavefront compensation can be included in the collimators or in the combined collimator/deflector arrangements.

The principal advantage of the present invention is that it provides a multi-wavelength laser array using a uniform volume holographic grating. This significantly reduces the cost of manufacture as such gratings are readily available and are significantly cheaper than the wavelength chirped gratings currently used.

It is a further advantage of at least one embodiment of the present invention, in that it provides a laser bar where each emitter is locked to a different wavelength using a single volume holographic grating.

Various modifications may be made to the invention herein described without departing from the scope thereof. For example, while laser diode bars comprising a plurality of laser diode emitters have been described the laser stack and laser bars could equally be comprised of discrete semiconductor laser emitters, or indeed fibre laser emitters. Other collimating optics could be used in place of the fast and slow axis collimators. While the deflectors are shown as single piece elements, these could be a combination of separate prisms, micro-lenses and mirrors. Also the second deflector could be either a single piece element with a reflective coating on its rear face and either its rear surface, or its front surface, or both its front and rear surfaces shaped to provide beam deflection.

We claim:

1. A multi-wavelength laser array, the array comprising:
    a plurality of emitters arranged on at least a first axis providing a plurality of beams substantially in a first direction orthogonal to the first axis;
    at least one first deflector arranged to deflect each beam on the first axis in a different direction;
    a uniform volume holographic grating arranged at a tilt angle to the first direction and each beam being incident upon the grating at a different angle;
    at least one second deflector arranged to deflect a feedback portion of each beam on itself to the respective emitter; and
    a further portion of each beam providing a wavelength tuned output unique to each beam on the first axis.

2. A multi-wavelength laser array according to claim 1 wherein the uniform volume holographic grating is selected to reflect a first portion of each beam and transmit a second portion of each beam and the at least one second deflector is arranged to return the first portion as the feedback portion of each beam.

3. A multi-wavelength laser array according to claim 1 wherein the at least one first deflector is a monolithic array of deflector elements.

4. A multi-wavelength laser array according to claim 1 wherein the at least one second deflector is a monolithic array of deflector elements having a mirrored back surface.

5. A multi-wavelength laser array according to claim 1 wherein the at least one first and second deflectors are created as a single monolithic array.

6. A multi-wavelength laser array according to claim 1 wherein the plurality of emitters is arranged on the first axis and wherein the first axis is the slow axis.

7. A multi-wavelength laser array according to claim 1 wherein the plurality of emitters is arranged on two axes perpendicular to each other and orthogonal to the first direction providing an array of diode bars in a stack.

8. A multi-wavelength laser array according to claim 7 wherein each diode bar on an axis has a unique wavelength, and the wavelength varies across the stack.

9. A multi-wavelength laser array according to claim 7 wherein each diode bar operates over the same wavelength range and the wavelength will vary along the bar.

10. A multi-wavelength laser array according to claim 7 wherein the deflector elements are selected for each emitter across both axes and thus each beam from the two-dimensional array has a separate distinct wavelength.

11. A multi-wavelength laser array according to claim 7 wherein each diode bar in a stack has a first and a second deflector.

12. A multi-wavelength laser array according to claim 1 wherein at least one collimator is located between the emitters and the at least one first deflector.

13. A multi-wavelength laser array according to claim 12 wherein the at least one collimator is a slow axis collimator on a first axis and a fast axis collimator on a second axis.

14. A multi-wavelength laser array according to claim 1 wherein the first deflector is combined with a slow axis collimator.

15. A multi-wavelength laser array according to claim 1 wherein the multi-wavelength laser array further comprises a third deflector, the third deflector arranged to deflect the wavelength tuned output on exit from the uniform volume holographic grating.

16. A multi-wavelength laser array according to claim 1 wherein the multi-wavelength laser array further comprises a quarter-wave-plate and polarising beam splitter combination, the combination being located between the emitters and the first deflector, to redirect the first portion towards the second deflector.

17. A multi-wavelength laser array according to claim 1 wherein the multi-wavelengths are stepped to provide distinct wavelengths of narrow spectra that are distinguishable between the output beams.

18. A multi-wavelength laser array according to claim 1 wherein the spacing between the central wavelengths for adjacent emitters is smaller than the spectral width for an individual emitter, in which case the spectra of adjacent emitters overlap and the overall spectrum of the combined output is continuous.

19. A multi-wavelength laser array according to claim 1 wherein the multi-wavelength laser array also comprises wavelength multiplexing optics to combine the beams into a single beam of multiple wavelengths.

20. A method of obtaining a multi-wavelength output from a laser array, the method comprising the steps:
  (a) providing an array of emitters, each emitter having an output beam;
  (b) directing the output beams to be incident upon a uniform volume holographic grating at different angles of incidence;
  (c) deflecting a portion of the output beams back into their respective emitters and thereby locking each emitter output beam to a different wavelength; and
  (d) taking a remaining portion of the output beams as a multi-wavelength output of the laser array.

21. A multi-wavelength laser array, the array comprising:
  a plurality of emitters arranged on at least a first axis providing a plurality of beams substantially in a first direction orthogonal to the first axis;
  at least one first deflector arranged to deflect each beam on the first axis in a different direction;
  a uniform volume holographic grating arranged at a tilt angle to the first direction and each beam being incident upon the grating at a different angle;
  at least one second deflector arranged to deflect a feedback portion of each beam on itself to the respective emitter;
  a further portion of each beam providing a wavelength tuned output unique to each beam on the first axis; and
  wherein the at least one first and second deflectors are created as a single monolithic array.

* * * * *